United States Patent
Wu

(10) Patent No.: US 6,261,898 B1
(45) Date of Patent: Jul. 17, 2001

(54) METHOD FOR FABRICATING A SALICIDE GATE

(75) Inventor: Der-Yuan Wu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/654,008

(22) Filed: Sep. 1, 2000

(51) Int. Cl.⁷ .................................................. H01L 21/8242
(52) U.S. Cl. .......................... 438/241; 438/592; 438/948; 438/949
(58) Field of Search .................................. 438/241, 258, 438/592, 948, 949

(56) References Cited

U.S. PATENT DOCUMENTS

| | | | |
|---|---|---|---|
| 5,719,079 | * 2/1998 | Yoo et al. | 438/238 |
| 5,863,820 | * 1/1999 | Huang | 438/241 |
| 5,998,252 | * 12/1999 | Huang | 438/241 |
| 6,004,843 | * 12/1999 | Huang | 438/241 |
| 6,015,730 | * 1/2000 | Wang et al. | 438/241 |
| 6,015,748 | * 1/2000 | Kim et al. | 438/592 |
| 6,037,222 | * 3/2000 | Huang et al. | 438/257 |
| 6,162,675 | * 12/2000 | Hwang et al. | 438/241 |
| 6,171,942 | * 1/2001 | Lee et al. | 438/596 |

* cited by examiner

Primary Examiner—Richard Booth
(74) Attorney, Agent, or Firm—Thomas, Kayden, Horstemeyer & Risley, LLP

(57) ABSTRACT

A method of fabricating a salicide gate is provided, wherein a logic region and a memory cell region are formed on a substrate. A plurality of polysilicon gates and adjoining source/drain regions are also formed in both regions. A protection layer is formed to cover the polysilicon gates and the source/drain regions, followed by forming a photoresist layer on the substrate. A blanket defocus exposure is then conducted, whereby a part of the protection layer on the top surface of the polysilicon gates in both regions is eventually removed. Another photoresist layer is formed in the memory cell region, while the protection layer in the logic region is removed. A self-aligned silicide process is then conducted to form the salicide gates in both regions, and to selectively forming salicide layers on the source/drain regions in the logic region only.

10 Claims, 4 Drawing Sheets

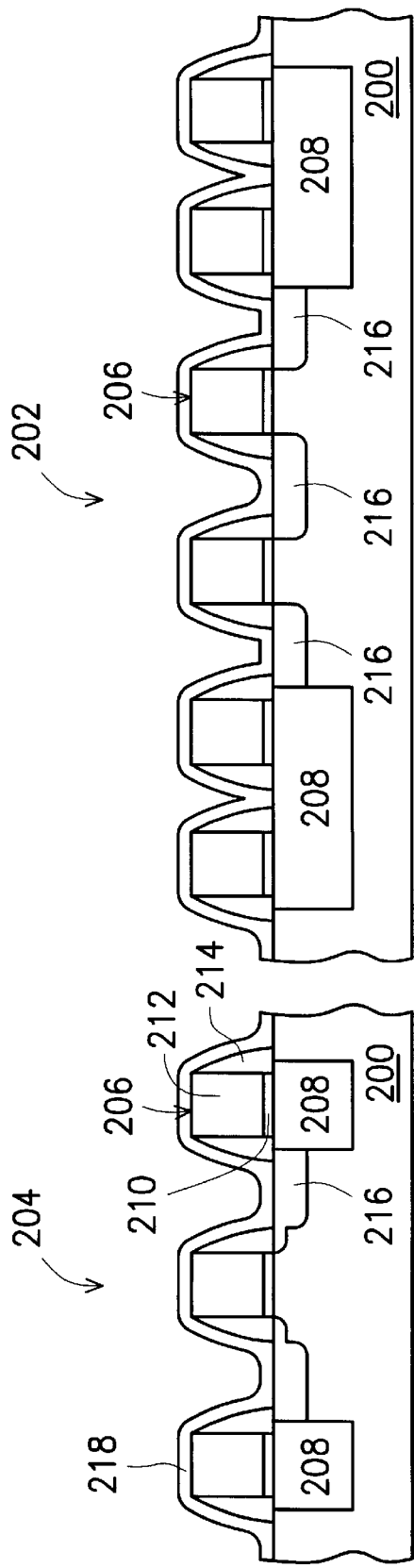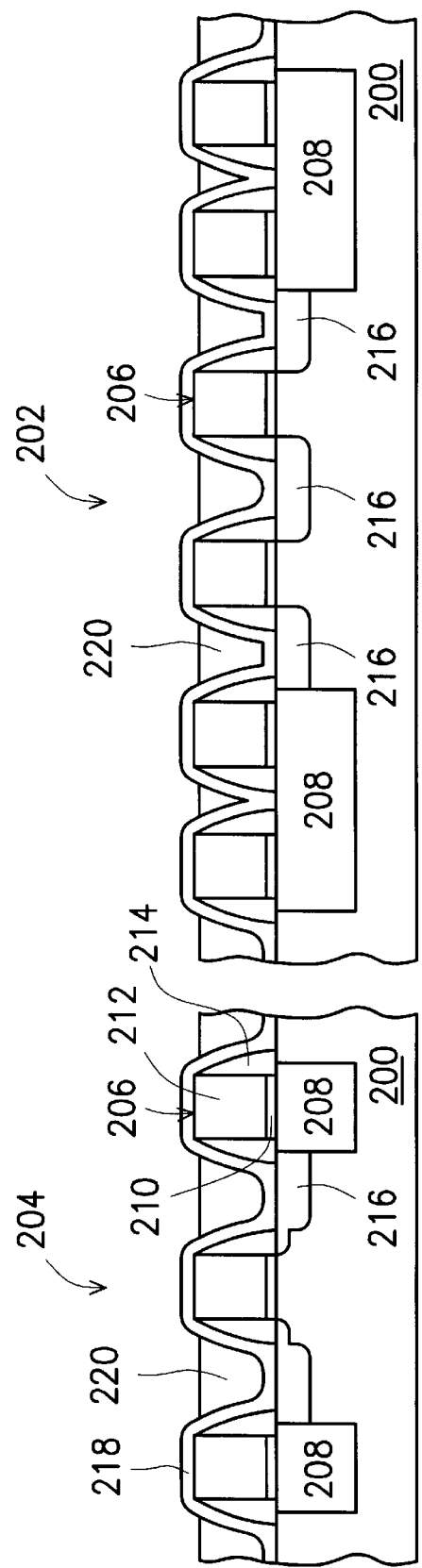

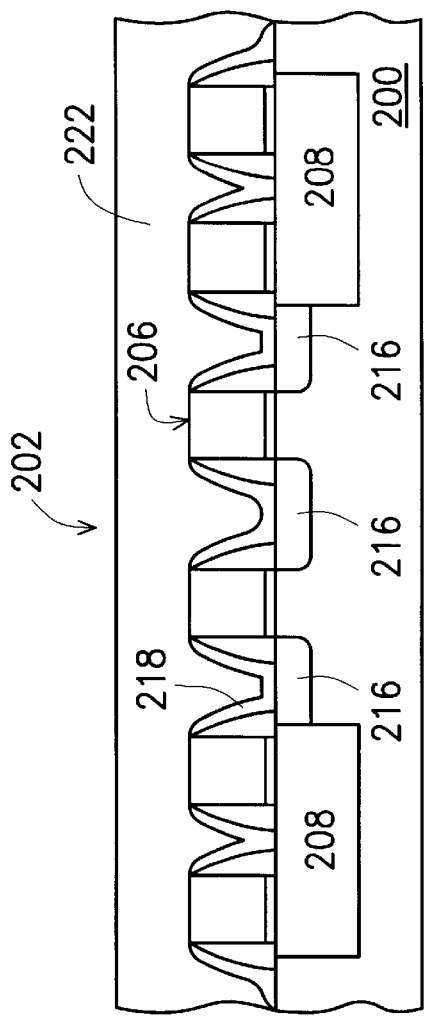
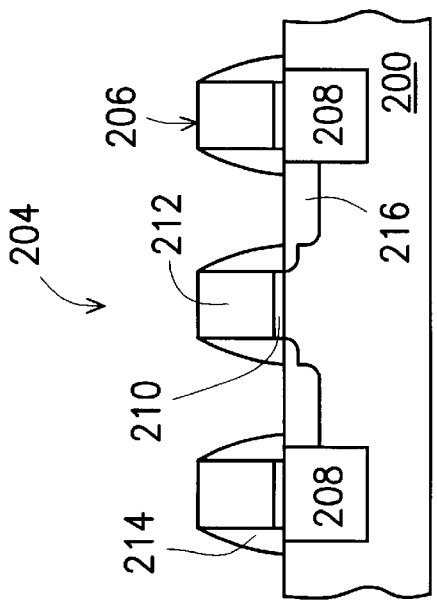
FIG. 2C
FIG. 2D

METHOD FOR FABRICATING A SALICIDE GATE

BACKGROUND OF THE INVENTION

1. Field of the Invention

The present invention relates to a fabrication method for a semiconductor device. More particularly, the present invention relates to a fabrication method for a salicide gate.

2. Description of the Related Art

There is a continuing effort in the semiconductor industry to increase the integration of a semiconductor device, for example, a Dynamic Random Access Memory (DRAM) device. The DRAM device is composed, in part, of an array of memory cells. Each RDAM cell is formed with a capacitor for storing an electrical charge representing a bit of data, and a transistor, controlled through a word line, for selectively coupling the capacitor to a bit line. The increase of the integration is normally accompanied by a decrease of the device dimension. As a result, the dimension of a polysilicon gate is decreased, leading to an increase of the gate resistance and the gate response time.

Currently, the common approach to reduce the gate response time and to increase the operational speed of a device is to form a low contact resistance layer, for example, a metal silicide layer, on the polysilicon gate in order to avoid the gate electrical circuit delay induced by the higher contact resistance. The resulting polysilicon/metal silicide gate has been typically formed through a self-aligned silicide process, for example, as a tungsten salicide (WSi) gate. FIGS. 1A to 1B are cross-sectional views showing the processing of a tungsten salicide gate according to the prior art.

As shown in FIG. 1A, a substrate 100, comprising device isolation structures are to define the active region, is provided. A gate oxide layer 110 and a polysilicon gate 120, wherein spacers 130 are formed on the sidewalls of the polysilicon gate, are formed on the substrate 100. An ion implantation is then conducted to form the source/drain regions 140 in the substrate 100 on both sides of the polysilicon gate 120. Thereafter, a metal layer 150, for example, a tungsten layer, is deposited on the substrate 100.

Continuing to FIG. 1B, a thermal process is conducted to induce a reaction between the metal layer 150 (as shown in FIG. 1A) and the source/drain regions 140 and the polysilicon gate 120, respectively, to form a salicide layer 160 on the source/drain region 140 and a salicide layer 160 on the polysilicon gate 120. The unreacted metal layer 150, as shown in FIG. 1A, is subsequently removed to complete the manufacturing of a tungsten salicide gate 180.

This conventional approach in forming a salicide gate, however, has its disadvantages, especially when the capacitor is being used as a dynamic random access memory (DRAM) device. Although the gate resistance is reduced in the conventional approach, a low resistance salicide layer is also formed on the surfaces of the adjoining source/drain regions. A higher current leakage is thus resulted at the source/drain regions, which would lead to the loss of the stored data and adversely affecting the data retention characteristics of the DRAM cell. The DRAM cell must therefore be refreshed frequently and the operational efficiency of the device is thereby reduced.

SUMMARY OF THE INVENTION

Based on the foregoing, the present invention provides a fabrication method for salicide gates, which is applicable to a DRAM device, wherein a substrate comprising a memory cell region and a logic region, is provided. A plurality of polysilicon gates and adjoining source/drain regions are formed in both the memory cell region and the logic region. A conformal protection layer and a first photoresist layer are sequentially formed on the source/drain regions and the polysilicon gates. A blanket defocus exposure is then conducted, wherein only the portion of the first photoresist layer above the top surface of the polysilicon gates is subsequently removed. After this, the exposed protection layer is removed, followed by forming a second photoresist layer on the memory cell region. Using the second photoresist layer as a mask, the remaining protection layer in the logic region is removed. A self-aligned silicide processing is then conducted to form the salicide gates.

According to the preferred embodiment of the present invention, the salicide layers are selectively formed on the polysilicon gates in both the logic and the memory cell regions and on the source/drain regions in the logic region only. The problem of charge leakage from the source/drain regions, leading to a loss of the stored data, is thus prevented. The problem of increasing the refreshing frequency of the DRAM cell is thus avoided and the operational efficiency of the device can be maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A to 2E are schematic, cross-sectional views showing the manufacturing of a salicide gate according to the preferred embodiment of the present invention.

DESCRIPTION OF THE PREFERRED EMBODIMENT

Figure 1A:
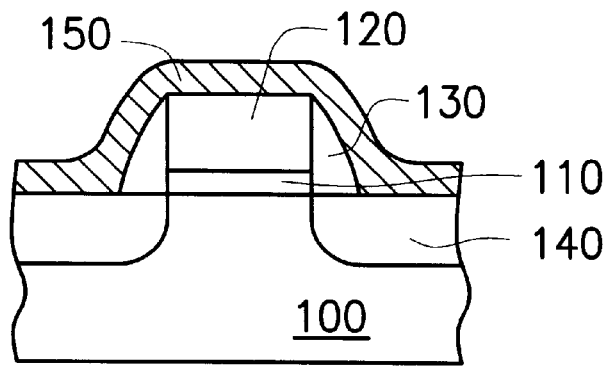
FIGS. 1A to 1B are schematic, cross-sectional views showing the manufacturing of a salicide gate according to the prior art.
Figure 1B:
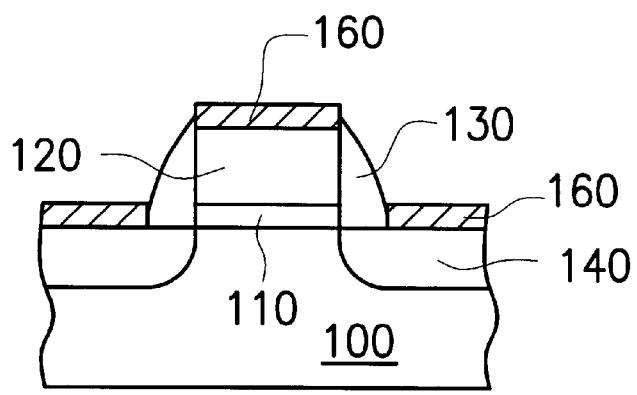

The fabrication method for a salicide gate, respectively in accordance with the present invention is described with reference to FIGS. 2A to 2E. FIGS. 2A to 2E represent cross-sectional views showing various stages of the fabrication process of a salicide gate according to one embodiment of the present invention.

Referring to FIG. 2A, a substrate 200, wherein device isolation structures 208 are formed to define the active regions on the substrate 200. The active regions include a memory cell region 202 and a logic region 204. A plurality of polysilicon gates 206 are formed in both the memory cell region 202 and the logic region 204. The polysilicon gates 206 comprise at least a gate oxide layer 210 and a polysilicon layer 212 with spacer 214 on the sidewalls of the polysilicon gates 206. Source/drain regions 216 are also formed on both sides of the polysilicon gates 206 in the substrate 200. A conformal protection layer, for example, a silicon nitride layer 218 is then formed on the substrate 200, covering the polysilicon gates 206 and the adjoining source/drain regions 216 in both the logic region 204 and the memory cell region 202.

Referring to FIG. 2B, a photoresist layer is spin-coated on the substrate 200, covering the polysilicon gates 206 in both regions 202 and 204. A defocus blanket exposure is then conducted on the entire substrate 200. The exposure energy and the focus setting condition are properly adjusted to allow only the top layer of the photoresist layer 220 to receives an adequate exposure energy. After the development and the rinsing processes, a portion of the photoresist layer is removed. The remaining of the photoresist layer 220 exposes a part of the silicon nitride layer 218 that covers the top surface of the polysilicon gates 206.

Continuing to FIG. 2C, using the photoresist layer 220 (as in FIG. 2B) as a mask, the exposed part of the silicon nitride layer 218 on the top surface of the polysilicon gates 206 is removed, for example, by an etching back process. The remaining of the photoresist layer 220 is also subsequently removed.

Still referring to FIG. 2C, a photoresist layer 222 is spin-coated to cover the in the memory cell region 202, whereas the logic region 204 is remained exposed. Using the photoresist layer 222 to serve as a mask, the remaining silicon nitride layer 218 that covers the polysilicon gates 206 and the source/drain regions 216 in the logic region 204 is removed. Since the memory cell region 202 is covered by the photoresist layer 220, the remaining silicon nitride layer 218 on the polysilicon gates 206 and the source/drain regions 216 in the memory cell region 202 are prevented from being removed.

Continuing to FIG. 2D, the photoresist layer 222 (as shown in FIG. 2C) in the memory cell region 202 is removed. A metal layer 224 is then formed on the substrate 200. The metal layer 224 includes titanium (Ti) and cobalt (Co), is formed by, for example, sputtering deposition. Since the source/drain regions 216 in the memory cell region 202 are isolated by the silicon nitride layer 218, the metal layer 224 is only in contact with the polysilicon gates 206, and not with the source/drain regions 216.

Figure 2E:
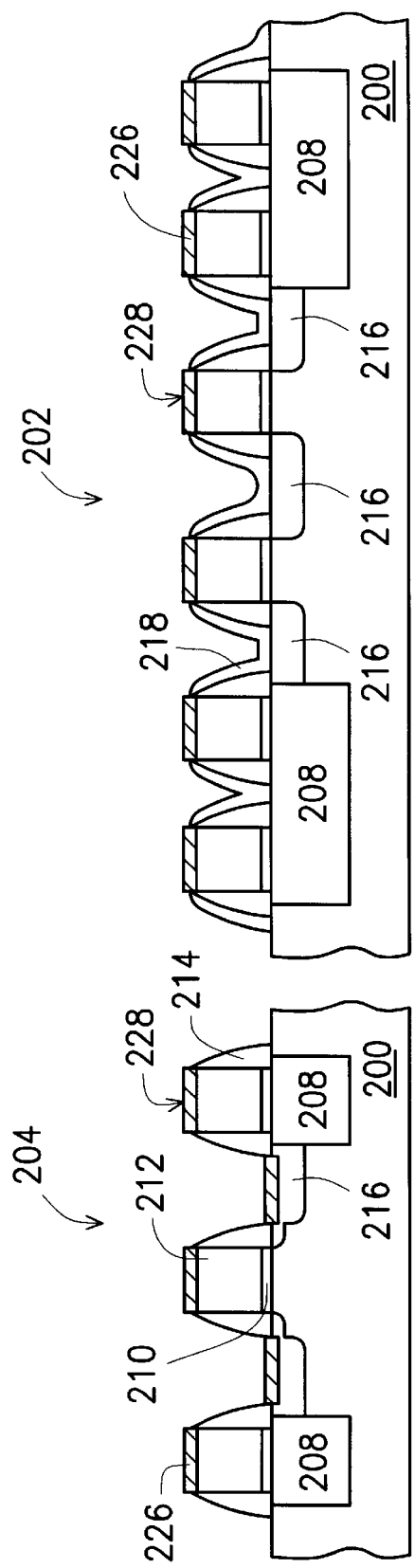

As shown in FIG. 2E, a thermal process is conducted to induce a reaction between the metal layer 224 (as in FIG. 2D) and the polysilicon gates 206 and the source/drain regions 216, respectively. Self-aligned silicide layers or a salicide layers 226 are then formed on the polysilicon gates 206 in both the memory cell region 202 and the logic region 204, and on the surfaces of the source/drain regions 216 in the logic region 204. The thermal process includes a rapid thermal process, and is conducted at a temperature of about 800 degree Celsius to about 1000 degree Celsius. The unreacted metal layer 224 is then subsequently removed to complete the formation of a salicide gate 228.

According to the preferred embodiment of the present invention, a defocus blanket exposure is conducted which would allow an eventual removal of only the portion of the protection layer on the top surfaces of the polysilicon gates in both the logic and the memory cell regions. Furthermore, the protection layer on the source/drain regions in the memory cell region is prevented from being removed. Being isolated by the protection layer, the metal layer is thus prevented to be in contact with the source/drain regions in the memory cell region. The metal silicide layers can thereby be formed by a self-aligned approach and are limited to the polysilicon gates, and the source/drain regions in the logic region. Since a low resistance layer is obviated from being formed on the source/drain regions in the memory cell region, a higher junction leakage between the source/drain regions and the capacitor is prevented. The subsequent loss of the stored data and the adverse effects on the data retention characteristics of the DRAM cell are thus avoided.

Furthermore, the present invention provides a method for forming a salicide layer on the polysilicon gates, and on the source/drain regions in the logic region only. Photography and etching, which are conducted in the conventional practice to selectively remove the salicide layers formed on the source/drain regions in the memory cell region, are thus eliminated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a salicide gate, wherein a substrate comprising a logic region and a memory cell region is provided, the method comprising:

forming a plurality of gate structures in the logic region and the memory cell region, wherein spacers are formed on sides of the gate structures and source/drain regions are formed on both sides of the gate structures in the substrate;

forming a conformal protection layer on the substrate to cover the gate structures and surfaces of the source/drain regions in both the memory cell region and the logic region;

forming a first photoresist layer to cover the memory cell region and the logic region;

performing a blanket defocus exposure process;

removing a portion of the first photoresist layer, wherein the protection layer on top surfaces of the gate structures in the memory cell region and the logic region are exposed;

removing the exposed protection layer, removing the first photoresist layer;

forming a second photoresist layer on the memory cell region;

removing a remaining protection layer on the gate structures and the source/drain regions in the logic region when the second photoresist layer covers the memory cell region;

removing the second photoresist layer; and forming a salicide layer on the gate structures in the logic region and the memory cell region and on the source/drain regions in the logic region.

2. The method according to claim 1, wherein forming the salicide layer further includes:

forming a metal layer on the substrate;

performing a thermal process to induce a reaction between the metal layer and the gates and the source/drain regions, respectively, wherein the thermal process is conducted at a temperature of about 400 degree Celsius to about 800 degree Celsius; and removing an unreacted metal layer.

3. The method according to claim 2, wherein the metal layer includes titanium or cobalt.

4. A fabrication method for a salicide gate, comprising:

providing a substrate having a logic region and a memory cell region;

forming a plurality of gate structures in the logic region and the memory cell region, wherein spacers are formed on sides of the gate structures and source/drain regions are formed on both sides of the gate structures in the substrate;

forming a conformal protection layer on the substrate to cover the gate structures and surfaces of the source/drain regions in both the memory cell region and the logic region;

forming a first photoresist layer to cover the memory cell region and the logic region;

performing a blanket defocus exposure process, wherein an exposure energy and a focus setting condition for the blanket defocus exposure process are properly adjusted to allow only a top layer of the photoresist layer to receive an adequate exposure energy;

removing a portion of the first photoresist layer, wherein the protection layer on top surfaces of the gate structures in the memory cell region and the logic region are exposed;

removing the exposed protection layer;

removing the first photoresist layer;

forming a second photoresist layer on the memory cell region;

removing a remaining protection layer on the gate structures and the source/drain regions in the logic region;

removing the second photoresist layer; and forming a salicide layer on the gate structures in the logic region and the memory cell region and on the source/drain regions in the logic region.

5. The method according to claim 1, wherein the gate structure comprises at least a polysilicon layer and a gate oxide layer.

6. The method according to claim 1, wherein the protection layer includes a chemically vapor deposited silicon nitride layer.

7. A fabrication method for a salicide layer on a DRAM device, the method comprising:

forming a plurality of polysilicon gates on a substrate, wherein spacers are formed on sidewalls of the polysilicon gates;

forming source/drain regions on both sides of the polysilicon gates in the substrate;

forming a conformal protection layer on the substrate to cover the source/drain regions and the polysilicon gates;

forming a photoresist layer on the substrate;

performing a blanket defocus exposure process, wherein a exposure energy and a focus setting condition in the blanket defocus exposure process are properly adjusted to allow only a top of the photoresist layer to receive an adequate exposure energy;

removing a portion of the photoresist layer to expose a part of the protection layer on a top surface of the polysilicon gates;

removing the exposed protection layer; and forming a salicide layer on the polysilicon gates.

8. The method according to claim 7, wherein the salicide layer includes a titanium salicide layer.

9. The method according to claim 7, wherein the salicide layer includes a cobalt salicide layer.

10. The method according to claim 7, wherein the protection layer includes a chemically vapor deposited silicon nitride.

* * * * *